United States Patent
Matsushima et al.

(10) Patent No.: US 8,401,347 B2
(45) Date of Patent: Mar. 19, 2013

(54) PHOTOELECTRIC COMPOSITE WIRING MODULE AND METHOD FOR MANUFACTURING THE SAME

(75) Inventors: Naoki Matsushima, Yokohama (JP); Norio Chujo, Tokyo (JP); Yasunobu Matsuoka, Hachioji (JP); Toshiki Sugawara, Kokubunji (JP); Madoka Minagawa, Yokohama (JP); Saori Hamamura, Fujisawa (JP); Satoshi Kaneko, Yokohama (JP); Tsutomu Kono, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 186 days.

(21) Appl. No.: 12/623,686

(22) Filed: Nov. 23, 2009

(65) Prior Publication Data

US 2010/0209041 A1    Aug. 19, 2010

(30) Foreign Application Priority Data

Feb. 13, 2009  (JP) ................. 2009-030637
Oct. 8, 2009  (JP) ................. 2009-233978

(51) Int. Cl.
*G02B 6/12* (2006.01)
(52) U.S. Cl. .......................................... 385/14
(58) Field of Classification Search ........... 385/14
See application file for complete search history.

(56) References Cited

U.S. PATENT DOCUMENTS

| | | | |
|---|---|---|---|
| 6,693,736 B1 * | 2/2004 | Yoshimura et al. | 359/333 |
| 6,885,099 B2 | 4/2005 | Ogawa | |
| 7,092,603 B2 * | 8/2006 | Glebov et al. | 385/51 |
| 7,257,282 B2 * | 8/2007 | Iwasaki | 385/14 |
| 7,292,744 B2 * | 11/2007 | Ouchi | 385/14 |
| 7,386,200 B2 * | 6/2008 | Uchida | 385/17 |
| 7,437,030 B2 * | 10/2008 | Asai et al. | 385/14 |
| 7,496,251 B2 * | 2/2009 | Cohen et al. | 385/14 |
| 7,778,501 B2 * | 8/2010 | Beausoleil et al. | 385/14 |
| 8,148,735 B2 | 4/2012 | Horio et al. | |
| 2003/0123819 A1 * | 7/2003 | Nakanishi et al. | 385/92 |
| 2004/0150081 A1 | 8/2004 | Ogawa | |
| 2007/0045746 A1 * | 3/2007 | Sunohara et al. | 257/360 |
| 2007/0045804 A1 * | 3/2007 | Lin et al. | 257/686 |
| 2007/0263957 A1 | 11/2007 | Shimizu et al. | |
| 2009/0039377 A1 | 2/2009 | Horio et al. | |
| 2010/0027946 A1 * | 2/2010 | Dutta | 385/88 |

FOREIGN PATENT DOCUMENTS

| | | |
|---|---|---|
| CN | 101010609 A | 8/2007 |
| JP | 2001-183556 A | 7/2001 |
| JP | 2004-177521 | 6/2004 |
| JP | 2004-177521 A | 6/2004 |
| JP | 2004-233991 A | 8/2004 |
| JP | 2004-319555 A | 11/2004 |
| JP | 2006-133763 A | 5/2006 |
| KR | 10-2004-0036614 A | 4/2004 |
| KR | 10-2007-0107734 A | 11/2007 |

* cited by examiner

*Primary Examiner* — Charlie Peng
(74) *Attorney, Agent, or Firm* — Mattingly & Malur, P.C.

(57) ABSTRACT

A photoelectric composite wiring module includes a circuit substrate, an optical device, an LSI (device) having a driver and an amplifier for the optical device, and a thin film wiring layer having an electrical wiring. The optical device is connected with the LSI by means of the electrical wiring. The optical device is formed on the circuit substrate and optically coupled to an optical waveguide formed in the circuit substrate. The thin film wiring layer is formed on the optical device to ensure that the optical device is electrically connected with the electrical wiring of the thin film wiring layer. The LSI is mounted on and electrically connected with the thin film wiring layer.

18 Claims, 6 Drawing Sheets

PHOTOELECTRIC COMPOSITE WIRING MODULE AND METHOD FOR MANUFACTURING THE SAME

BACKGROUND OF THE INVENTION

1. Field of the Invention

The present invention relates to a photoelectric composite wiring module that processes a large amount of optical signals transmitted and received by a transmission device, and to a method for manufacturing the photoelectric composite wiring module.

2. Description of the Related Art

In recent years, infrastructures for communication traffic of optical signals have been rapidly improved in the information and communication fields. Optical fiber networks such as backbone, metro and access networks have so far been developed for a relatively long distance of several kilometers or more. From now, it is effective to use optical signals also in order to process, without a delay, a large amount of data that is transferred over a short distance, i.e., between transmission devices whose distance is a length of several meters to several hundred meters or between components in a device whose distance is as short as several centimeters to several ten centimeters. With such a trend, an attempt has been made to use optical signals for performing data transfer between LSIs incorporated in an information device such as a router or server or between an LSI and a backplane.

To build an optical signal transmitting structure, it is important to properly design coupling portions between a photoelectric transducer (optical device) and an optical waveguide or an optical transmission channel such as an optical fiber. For transmission of light emitted from a light emitting device to an optical wiring or for incidence of light transferred through the optical transmission channel in a light receiving device, the optical device needs to be aligned with the optical transmission channel with high accuracy in order to achieve thoroughly efficient optical coupling. On the other hand, when mass productivity and practicality are taken into consideration, it is desirable to mount optical couplers and LSIs used for an information device in such a manner that they may be easily removable and replaceable.

For example, JP-A-2006-133763 discloses a module having an optical device and an optical transmission channel. The optical device is aligned with the optical transmission channel by means of a guide pin for their optical coupling, while the optical device and an LSI are mounted by means of socket pins. Thus, the optical device can be aligned with the optical transmission channel relatively with ease. In addition, a mounting and demounting operation of the LSI is easy to perform since the LSI is mounted by using the socket pins.

JP-A-2004-233991 discloses a module having a substrate and an LSI. The substrate includes an optical waveguide and an optical device that is located under the optical waveguide. In operation, the optical device is adapted to transmit an optical signal to the LSI.

SUMMARY OF THE INVENTION

The modules disclosed in JP-A-2006-133763 and JP-A-2004-233991 have the following problems. First, a distance between the optical device and the LSI cannot be reduced. In the structure described in JP-A-2006-133763, the optical device is located not directly below the LSI but outside the LSI. In order to transmit a signal from the LSI to the optical device, the LSI and the optical device need to be connected to each other by means of an electrical wiring. In the structure described in JP-A-2004-233991, the optical device is located on the opposite side to the LSI with respect to the substrate. Thus, the length of an electrical wiring extending from the optical device to the LSI is large. Even when the LSI transmits a signal at a higher transmission rate, a transmission rate in the electrical wiring is limited. Thus, the transmission rate is not obtained sufficiently. In addition, since the long electrical wiring is laid, an optical loss is increased by amounts corresponding to the excessively long part of the total length of the electrical wiring. As a result, power consumed by the module may be increased. Since the module cannot have a sufficiently high packaging density, the substrate of the module may be made larger. When the optical device is to be efficiently aligned with the optical transmission channel over all of the channels with positional tolerances of a guide pin and a socket pin in mind, a large stress is applied to a joint portion of the optical device and the optical transmission channel. It is expected that the reliability of the module will be significantly decreased.

An object of the present invention is to provide a photoelectric composite wiring module that has a detachable LSI and an optical device with a small distance between the LSI and the optical device, and is capable of transmitting a signal at a high rate per channel and operating with low power consumption, and has a detachable part for practical use, a transmission device using the photoelectric composite wiring module, and a method for manufacturing the photoelectric composite wiring module.

To accomplish the object of the present invention, a photoelectric composite wiring module includes:

a first circuit substrate having an optical waveguide in which an optical signal propagates;

an optical device mounted on a surface of the first circuit substrate and optically coupled to the optical waveguide;

an insulating film formed on the first circuit substrate and the optical device;

a wiring pad mounted on the insulating film;

an electrical wiring connecting the optical device with the wiring pad; and a first semiconductor device mounted on and electrically connected with the wiring pad;

wherein the optical device is located on a surface of the first circuit substrate, the surface of the first circuit substrate facing a side where the first semiconductor device is provided, the surface of the first circuit substrate being within a plane which projects the first semiconductor device on the surface of the first circuit substrate.

According to the present invention, the semiconductor device and the optical device can be electrically connected to each other by means of the thin film electrical wiring having a small length. This structure leads to an increase in a transmission rate per channel and prevents an increase in power consumption. In addition, the semiconductor device is mounted by means of a conventional simple technique such as solder bonding. Thus, the semiconductor device can be easily mounted, removed, and replaced with another one without any special technique. Furthermore, the semiconductor device can be mounted on a board of an information device by means of a conventional bonding technique or a connector without any special technique such as a high-accurate positioning technique. Thus, the semiconductor device can be easily mounted, removed and replaced with another one.

The photoelectric composite wiring module, therefore, is capable of transmitting a signal having a large amount and being easily assembled.

DESCRIPTION OF PREFERRED EMBODIMENTS

Embodiments of the present invention are described below in detail with reference to the accompanying drawings.

First Embodiment

Figure 1:
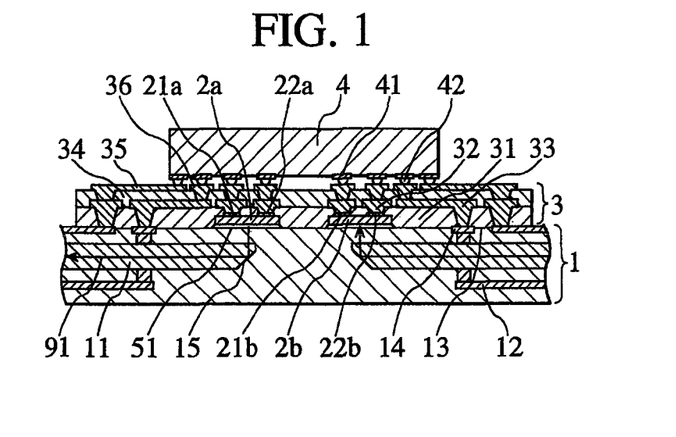
FIG. 1 is a schematic diagram showing a photoelectric composite wiring module according to a first embodiment of the present invention.

FIG. 1 is a cross-sectional view of a photoelectric composite wiring module according to the first embodiment of the present invention. The photoelectric composite wiring module has a first circuit substrate 1. The first circuit substrate 1 has two optical waveguides 11 that serve as optical transmission channels. The first circuit substrate 1 has electrical wirings 12 above or under the optical waveguides 11. The first circuit substrate 1 also has a surface layer 13 and electrode pads 14. The electrode pads 14 are provided in the surface layer 13. The electrode pads 14 are electrically connected with the electrical wirings 12, respectively. Each of the optical wave guides 11 includes an edge portion 15 having a surface inclined at an angle of 45 degrees. Each of the edge portions 15 serves to change a traveling direction of an optical signal 91 to a different direction to ensure that the two directions form an angle of approximately 90 degrees. In the present embodiment, the each of the optical waveguides 11 has two layers so that the first circuit substrate 1 has a high substrate density. Each of the optical waveguides 11, however, may only have one layer. Alternatively, each of the optical waveguides 11 may have three or more layers.

The photoelectric composite wiring module has optical devices 2a and 2b on the surface layer 13 of the first circuit substrate 1. In the present embodiment, the optical device 2a is a surface emitting semiconductor laser (light emitting element), and the optical device 2b is a surface incident photodiode (light receiving element). To achieve a high substrate density, it is desirable that each of the optical devices 2a and 2b be of array type. That is, the optical device 2a preferably has a plurality of light emitting points, and the optical device 2b preferably has a plurality of light receiving surfaces. However, the optical device 2a may have only one light emitting point (or may be of one channel type), and the optical device 2b may have only one light receiving surface (or may be of one channel type). The optical device 2a has electrodes 21a, 22a. The optical device 2b has electrodes 21b and 22b. The electrodes 21a and 22a cause a current to flow in the optical device 2a, while the electrodes 21b and 22b cause a current to flow in the optical device 2b. The electrodes 21a, 22a, 21b and 22b are located at the side opposite to the side of the circuit substrate 1. As shown in FIG. 1, the electrodes 21a and 22a are located on an upper side of the optical device 2a, and the electrodes 21b and 22b are located on an upper side of the optical device 2b. The photoelectric composite wiring module has a thin film wiring layer 3 that includes an electrical wiring 31. The electrical wiring 31 of the thin film wiring layer 3 is formed on the optical devices 2a and 2b. The electrodes 21a, 22a, 21b and 22b are electrically connected with the electrical wiring 31. The thin film wiring layer 3 also includes electrical wiring layers 33, 35, insulating layers 31, 34 and electrode pads 36. Each of the electrode pads 36 has a surface serving as a part of a surface of the thin film wiring layer 3. The optical device 2a has electrode pads. The optical device 2b has electrode pads. The electrode pads of the optical devices 2a and 2b are electrically connected with some of the electrode pads 36 through vias 32, respectively. The electrode pads 14 of the first circuit substrate 1 are electrically connected with the other electrode pads 36, respectively. The electrode pads 36 are located above the optical devices 2a and 2b.

The photoelectric composite wiring module has an LSI (semiconductor element) 4 located above the thin film wiring layer 3. The LSI 4 has electrode pads 41. The electrode pads 41 are electrically connected with the electrode pads 36 of the thin film wiring layer 3 through bumps 42. The bumps 42 may be solder balls, stud bumps made of Au, or plated bumps. In the present embodiment, the LSI 4 includes a driver for a semiconductor laser and an amplifier for a photodiode output signal. The semiconductor laser driver and the photodiode amplifier may be separated from the LSI 4. In the present embodiment, the optical devices 2a and 2b are located directly under the LSI 4. That is, the optical devices 2a and 2b are located in a projection plane obtained by projecting the LSI 4 onto the first circuit substrate 1. Thus, distances between the optical devices 2a, 2b and the LSI 4 are made small. In this structure of the photoelectric composite wiring module, a transmission rate is higher while power consumption is low. Since this structure has a small distance of wiring, the module can be easily manufactured.

Figure 2A:
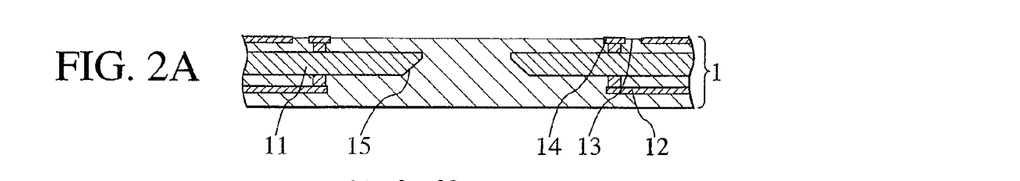
FIGS. 2A to 2F are schematic diagrams showing a method for manufacturing the photoelectric composite wiring module according to the first embodiment of the present invention.
Figure 2B:
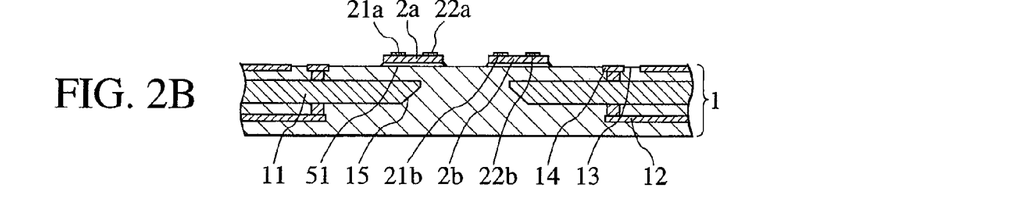

The following describes an example of a method for manufacturing the photoelectric composite wiring module (shown in FIG. 1) with reference to FIGS. 2A to 2F. FIG. 2A shows the first circuit substrate 1 having the two optical waveguides 11, the electrical wirings 12 and the electrode pads 14. The optical devices 2a and 2b are located on the surface layer 13 to ensure that the optical devices 2a and 2b are respectively optically coupled to the optical waveguide edge portions 15 (refer to FIG. 2B). In the present embodiment, an adhesive 51 is used to bond the circuit substrate 1 with the optical devices 2a and 2b. The adhesive 51 is transparent to a wavelength of light used in the module. The adhesive 51 is transferred to surfaces (to be bonded to the circuit substrate 1) of the optical devices 2a and 2b before the bonding. Then, the optical devices 2a and 2b are mounted on the circuit substrate 1 under the condition that the adhesive 51 is transferred to the surfaces of the optical devices 2a and 2b. However, the adhesive 51 may be dropped onto the circuit substrate 1. To mount the optical devices 2a and 2b on the first circuit substrate 1, it is necessary that the optical devices 2a and 2b be aligned with the edge portions 15 of the optical waveguides 11 so as to efficiently optically couple the optical devices 2a and 2b to the edge portions 15 of the optical waveguides 11, respectively. Thus, a mounting device (mounter or bonder) used to mount the optical devices 2a and 2b has a necessary degree of mounting accuracy. When the optical devices 2a and 2b of an array type are used, the number of the light emitting points of the optical device 2a and the number of the light receiving surfaces of the optical device 2b are larger compared with optical devices of a one channel type. However, the light emitting points and the light receiving surfaces are not misaligned. Even if at least one of the emitting points and the light receiving surfaces is misaligned, the misalignment(s) of the light emitting points and the light receiving surfaces is very small and can be ignored. This results from the fact that the light emitting points and the light receiving surfaces are simultaneously formed in a wafer process. In addition, the edge portions 15 of the optical waveguides 11 are not misaligned. Even if at least one of the edge portions 15 of the optical waveguides 11 is misaligned, the misalignment(s) of the edge portions 15 of the optical waveguides 11 is very small and can be ignored. This results from the fact that the edge portions 15 are simultaneously formed by photolithography or the like. The optical devices 2a and 2b, therefore, can be mounted on the circuit substrate 1 with a similar degree of accuracy to that necessary for the optical devices of one channel type. If the optical devices were optically coupled to the edge portions of the optical waveguides after being mounted on the module in a similar way to the module disclosed in JP-A-2006-133763, a significantly high degree of mounting accuracy would be required since misalignments of channels occur. The present invention can solve the problem, and the photoelectric composite wiring module according to the present invention can be easily formed with a high degree of mounting accuracy. In addition, such excessive stresses as may be applied to joint portions of the module described in JP-A-2006-133763 are not applied to the photoelectric composite wiring module according to the present invention. In addition, the optical devices 2a and 2b are optically coupled to the optical waveguides 11 with distances (i.e., the lengths of upper cladding portions of the optical waveguides, or the thickness of a resin layer formed on the surface layer) of several micrometers to several tens of micrometers, respectively. Thus, higher optical coupling efficiency is attained. The photoelectric composite wiring module according to the present embodiment does not have an air layer between the optical devices 2a, 2b and the optical waveguides 11. This does not lead to a reduction in optical output of the module that would otherwise be caused by intrusion of dust or a droplet. In the module disclosed in JP-A-2006-133763, since the optical device and the optical transmission channel (optical waveguide) are located far from an optical coupling region, the optical device and the optical transmission channel may be subjected to deformation caused by an external force and a thermal stress applied. Such deformation may cause a reduction in optical output of the module described in JP-A-2006-133763. In the photoelectric composite wiring module according to the present embodiment, such a reduction in the optical output does not occur. The photoelectric composite wiring module formed by the simple method described above provides a higher optical coupling efficiency and stability of the optical output. The photoelectric composite wiring module may have a light collection mechanism between the optical devices and the optical waveguides to further improve the optical coupling efficiency.

For the method of fixing the optical devices 2a and 2b, an opaque adhesive may be used as long as it does not obstruct optical paths. The optical devices 2a and 2b may be fixed to the circuit substrate 1 by soldering if the surfaces (located at the side of the circuit substrate 1) of the optical devices 2a and 2b can be metalized.

Figure 2C:
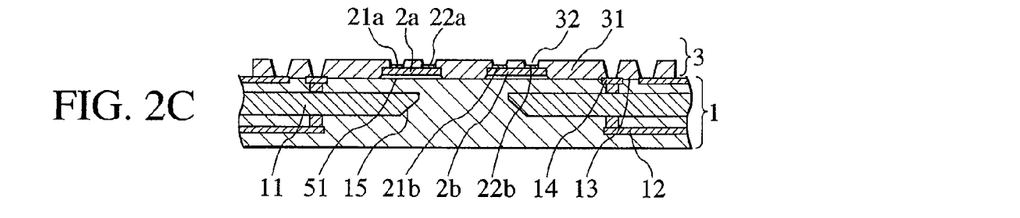

To form the thin film wiring layer 3 on the optical devices 2a and 2b and the first circuit substrate 1, insulating varnish resin is coated on the circuit substrate 1 to form the electrical wiring (first thin film insulating layer) 31. In the present embodiment, lithography is carried out using a photosensitive insulating resin material in order to form through-holes 32 in the insulating resin. After that, the resin material is hardened. Then, the vias 32 are formed to electrically connect electrodes of the optical devices to electrodes of the first circuit substrate 1. Thus, a structure shown in FIG. 2C is formed. To form the insulating resin, a B-stage resin film may be pressed and bonded to the first circuit substrate 1. Alternatively, the following method may be performed to form the first thin film insulating layer 31. A resin sheet having through-holes (in which the optical devices can be inserted) is pressed and bonded to the first circuit substrate 1, and varnish is filled into spaces located between surfaces (of the resin sheet) forming the through-holes and the optical devices 2a and 2b. To form the through-holes 32, dry etching, a method using a laser, sandblasting or the like may be performed. Next, in order to form the thin film electrical wiring 33, an electrically plated copper film is filled into the through-holes 32. A method (not shown in the accompanying drawings) for forming a wiring layer made of the electrically plated film is described as follows. First, a seed film is formed on the entire upper surface of the structure shown in FIG. 2C by sputtering. The seed film has an adhesive chromium layer and a copper layer laminated. Then, copper is electrically plated and filled into the through-holes. In the present embodiment, the structure is of filled-via type. The structure may be of conformal type, which does not have a conductive body at the center thereof. In addition, the electrical plating may not be performed, and only the sputtering may be performed to form the thin film electrical wiring 33. In this way, the copper film is formed on the entire upper surface of the structure shown in FIG. 2C. Then, separation of a wiring pattern is performed by lithography to form a structure shown in FIG. 2D.

Figure 2D:
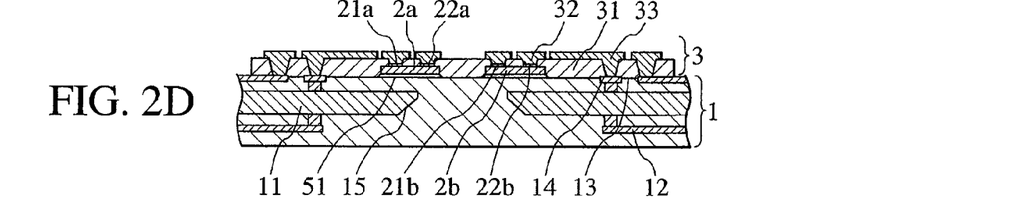
Figure 2E:
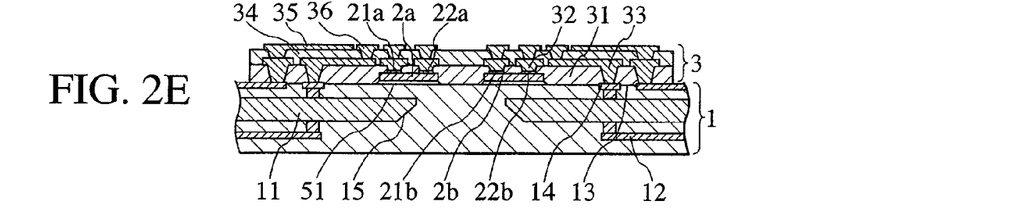

The process shown in FIG. 2C and the process shown in FIG. 2D are repeated to form a second insulating layer 34 and a second electrical wiring 35 of the thin film wiring layer 3 (refer to FIG. 2E). The electrode pads 36 are formed in the uppermost layer of the thin film wiring layer 3. A material appropriate for the bumps 42 (used to bond the LSI 4 to the thin film wiring layer 3) is used for the electrode pads 36. The electrode pads 36 electrically connected with the optical devices 2a and 2b are located directly above the optical devices 2a and 2b. In the present embodiment, an Ni—Au film (not shown) is formed as a solder connection electrode. In the present embodiment, the thin film wiring layer 3 has the two layers. One of the layers includes the insulating layer 31 and the wiring 33, and the other layer includes the insulating layer 34 and the wiring 35. The thin film wiring layer 3 may have only one layer (including the insulating layer 31 and the wiring 33), or may have three or more layers, depending on the LSI, the optical devices 2a and 2b, and the wirings between the LSI 4 and the first circuit substrate 1. A known method other than the method according to the present embodiment may be performed to form the thin film wiring layer 3.

Figure 2F:
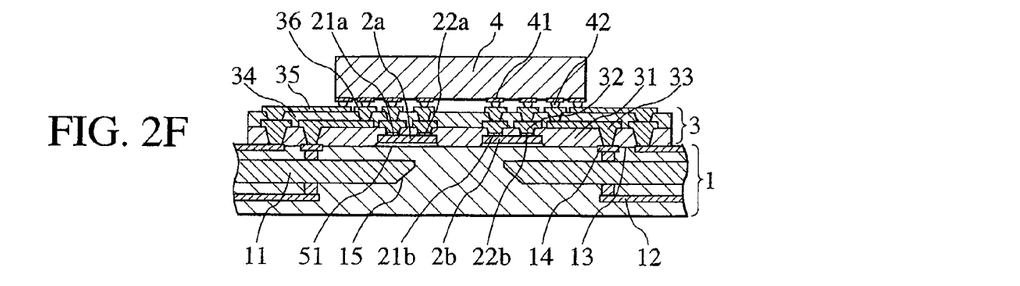

Lastly, the LSI 4 is formed on the thin film wiring layer 3 (refer to FIG. 2F). In the present embodiment, the LSI 4 includes the semiconductor laser driver and the photodiode amplifier integrated. The LSI 4 is bonded to the thin film wiring layer 3 by means of the bumps (Sn-based bumps) 42. Specifically, after the LSI 4 is mounted on the thin film wiring layer 3, reflow bonding is performed to bond the LSI 4 to the thin film wiring layer 3. The driver and the amplifier may be separated from the LSI 4 and mounted on the thin film wiring layer 3. Ultrasonic bonding using an Au bump, bonding using an Au bump and solder, bonding using a plated bump and solder, or the like may be performed to bond the LSI 4 to the thin film wiring layer 3. The advantage of the solder bonding is that the LSI 4 can be easily removed from the module and replaced with another one by increasing the temperature of the bumps to a temperature higher than the melting temperature of the solder used.

In order to improve mass productivity of the photoelectric composite wiring module according to the present invention, the photoelectric composite wiring module may have redundancy. In this case, the photoelectric composite wiring module has at least one pair of an optical device and an optical waveguide that are not used in a normal operational state, and has at least one pair of an optical device and an optical waveguide that are used in the normal operational state. If a failure occurs in the thin film wiring layer located between the optical device and the LSI, or if a failure occurs in the optical device or in the optical waveguide, the spare optical device, the spare optical waveguide, or a spare wiring is used. When the module having redundancy is formed without a failure, the module is set such that a spare circuit cannot be used physically or as a circuit.

Second Embodiment

Figure 3:
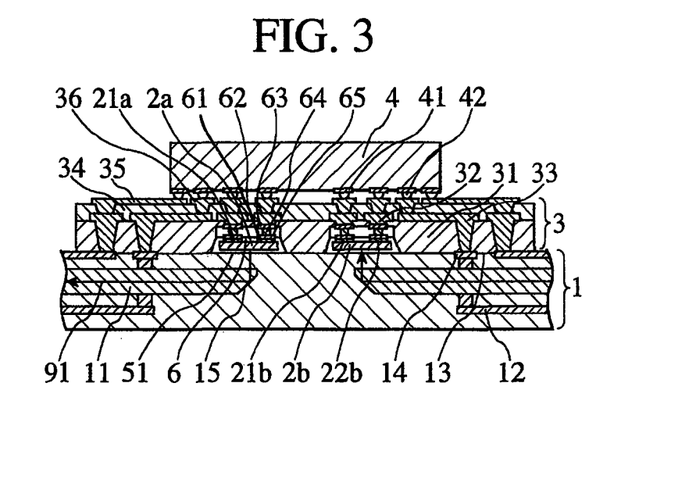
FIG. 3 is a schematic diagram showing a photoelectric composite wiring module according to a second embodiment of the present invention.

Next, a photoelectric composite wiring module according to the second embodiment of the present invention is described with reference to FIG. 3. The photoelectric composite wiring module according to the second embodiment has a second circuit substrate 6. The optical devices 2a and 2b are mounted on the second circuit substrate 6. This structure is different from the photoelectric composite wiring module according to the first embodiment. The second circuit substrate 6 includes an insulating substrate 61, wirings 62, 63 (located on upper and lower sides of the substrate 6) and a through-hole via 64. The through-hole via 64 electrically connects the wirings 62 and 63 with each other. The second circuit substrate 6 is used to easily inspect the optical devices 2a and 2b. When the optical devices 2a and 2b mounted on the second circuit substrate 6 are inspected, easy handling of the optical devices 2a and 2b is permitted, and it becomes easy to apply currents to the optical devices 2a and 2b. In the second embodiment, the optical devices 2a and 2b having large size can be mounted on the first circuit substrate 1, resulting in easy handling.

To bond the optical devices 2a and 2b to the second circuit substrate 6, solder 65 containing an Au—Sn material as a main component is used. Ultrasonic bonding using an Au bump, bonding using an Au bump and solder, a conductive adhesive, or the like may be performed or used to bond the optical devices 2a and 2b to the second circuit substrate 6.

In the second embodiment, the optical devices 2a, 2b are bonded to the first circuit substrate 1 under the condition that the optical devices 2a and 2b are bonded with the second circuit substrate 6. The optical devices 2a, 2b are located at the side of the first circuit substrate 1 with respect to the second circuit substrate 6. The second circuit substrate 6 has an electrode 63 that is electrically connected to an electrode of the thin film wiring layer 3. This structure is different from the module according to the first embodiment. Other configurations of the module according to the second embodiment are the same as those of the module according to the first embodiment. The adhesive 51 covers the whole optical device 2a and the whole optical device 2b and is coated on the second circuit substrate 6. The adhesive 51 may be coated only on surfaces of the first circuit substrate 1 that the optical devices 2a, 2b face in a similar way to the first embodiment.

Third Embodiment

Figure 4:
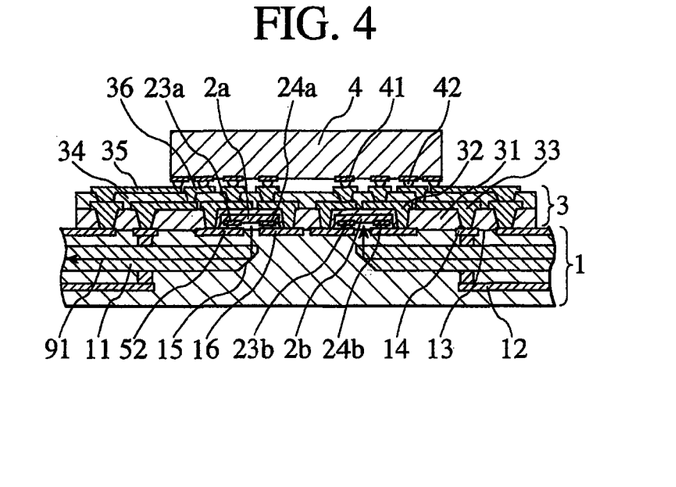
FIG. 4 is a schematic diagram showing a photoelectric composite wiring module according to a third embodiment of the present invention.

Next, a photoelectric composite wiring module according to the third embodiment of the present invention is described with reference to FIGS. 4 and 5A to 5F. FIG. 4 is a cross-sectional view of the photoelectric composite wiring module according to the third embodiment. FIGS. 5A to 5F are schematic diagrams showing a method for manufacturing the photoelectric composite wiring module according to the third embodiment. In the present embodiment, the optical device 2a has an electrode 23a located at the side of the first circuit substrate 1, and the optical device 2b has an electrode 23b located at the side of the first circuit substrate 1. The first circuit substrate 1 has electrodes 16 on its surface. The electrodes 16 are provided for connections of the optical devices 2a and 2b. The electrodes 16 are bonded to the optical devices 2a and 2b by means of bumps 24 (24a and 24b), respectively. The electrodes 16 are connected to the vias 32, respectively.

Figure 5A:
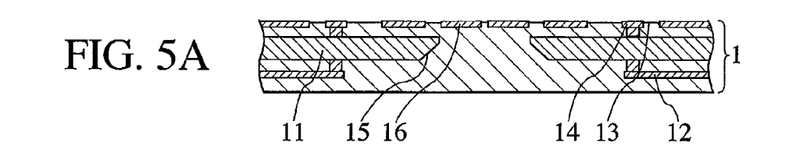
FIGS. 5A to 5F are schematic diagrams showing a method for manufacturing the photoelectric composite wiring module according to the third embodiment of the present invention.
Figure 5B:
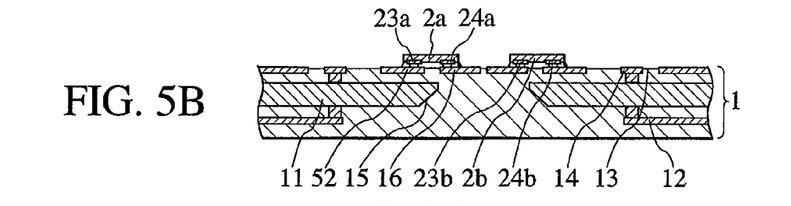
Figure 5C:
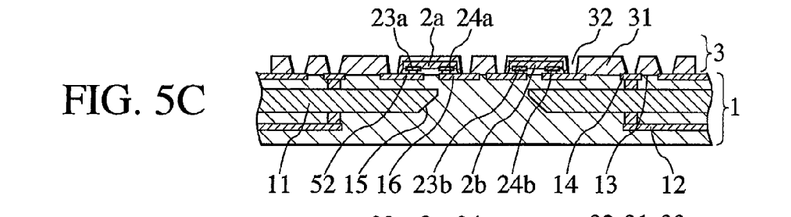
Figure 5D:
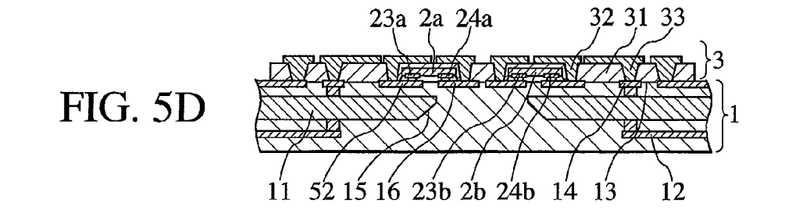
Figure 5E:
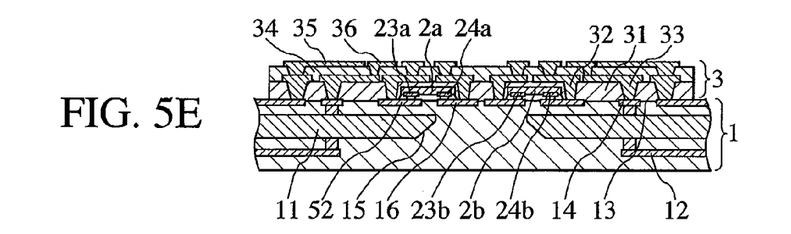
Figure 5F:
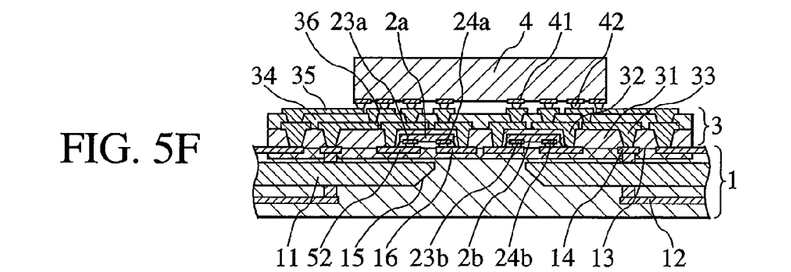

In the third embodiment, the electrodes 16 of the first circuit substrate 1, which are electrically connected to the respective optical devices 2a and 2b, are located near the optical devices 2a and 2b (refer to FIG. 5A). The optical devices 2a and 2b are bonded to the first circuit substrate 1 and electrically connected to the electrodes 16 of the first circuit substrate 1. In the present embodiment, the bumps 24 are stud bumps made of Au. The stud bumps 24a, 24b made of Au are respectively formed on the electrodes 23a, 23b of the optical devices 2a and 2b before the optical devices 2a and 2b are bonded to the first circuit substrate 1. Ultrasonic waves are applied to the stud bumps 24a, 24b and Au contained in the surfaces of the electrodes 16 to bond the optical devices 2a, 2b to the first circuit substrate 1. Next, resin 52 transparent to the wavelength of light to be used in the module is inserted into gaps formed between the surface layer 13 of the first circuit substrate 1 and the optical devices 2a and 2b. Then, the resin 52 is hardened. In the present embodiment, silicone resin is used as the resin 52. In this way, a structure shown in FIG. 5B is formed. Then, the thin film wiring layer 3 is formed on the structure shown in FIG. 5B. The vias 32 are formed in the insulating resin to electrically connect the optical devices 2a and 2b to the electrodes 16 formed on the surface layer 13 of the first circuit substrate 1 after the formation of the first insulating layer 31 of the thin film wiring layer 3 in the same way as the first embodiment. The through-holes 32 are not located on the electrodes of the optical devices 2a and 2b in the present embodiment although the though-holes are located on the electrodes of the optical devices 2a and 2b in the first embodiment. In the present embodiment, the through-holes 32 are located on the electrodes 16 (of the first circuit substrate 1) electrically connected to the optical devices 2a and 2b (refer to FIG. 5C). After that, the module is formed in the same manner as the formation described in the first embodiment. The electrical wirings 31 and 34 of the thin film wiring layer 3 are not directly connected to the electrodes of the optical devices 2a and 2b and are electrically connected to the electrodes 16 (of the first circuit substrate 1) that are electrically connected to the optical devices 2a and 2b (refer to FIGS. 5D to 5F).

When each of the optical devices 2a and 2b has electrodes on its upper and lower surfaces, the module is formed according to the first and third embodiments. Specifically, the electrodes 23a and 23b (located at the side of the first circuit substrate 1) of the optical devices 2a and 2b are connected with the vias 32 through the electrodes 16, while the electrodes (located at the side opposite to the side of the first circuit substrate 1) of the optical devices 2a and 2b are directly connected with the vias 32. The photoelectric composite wiring module according to the third embodiment and the photoelectric composite wiring module according to the first and third embodiments are applicable to the second embodiment describing the photoelectric composite wiring module having the optical devices mounted on the second circuit substrate.

Fourth Embodiment

Figure 6:
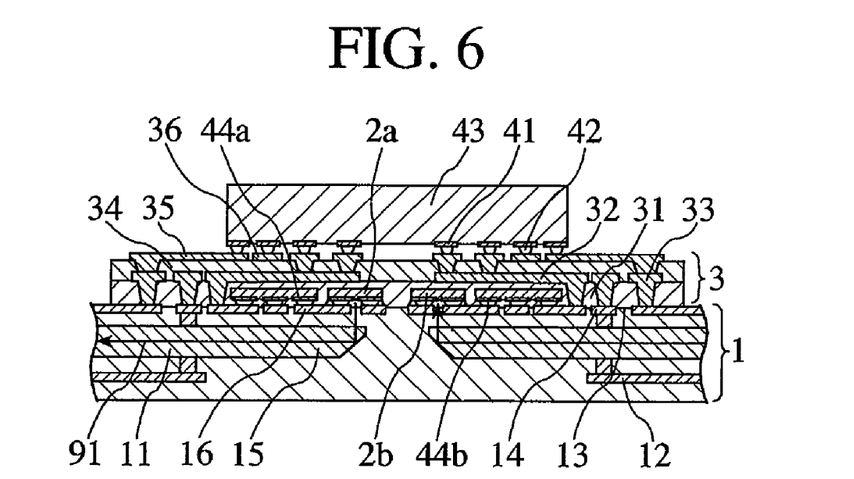
FIG. 6 is a schematic diagram showing a photoelectric composite wiring module according to a fourth embodiment of the present invention.

A photoelectric composite wiring module according to the fourth embodiment of the present invention is described with reference to FIG. 6. In the first to third embodiments, the LSI 4 is mounted only on the wiring layer 3. In the fourth embodiment, the LSI 4 is separated and mounted in the same layer as that in which the optical devices 2a and 2b are located. In the fourth embodiment, the separated parts of the LSI 4 are denoted by reference numerals 44a and 44b. The separated part (LSI) 44a is a driver that drives the light emitting device (optical device) 2a. The separated part (LSI) 44b is a transimpedance amplifier that converts a photocurrent of the light receiving device (optical device) 2b into a voltage and amplifies the voltage. In FIG. 6, reference numeral 43 denotes an LSI in which functions associated with the LSIs 44a and 44b are removed from the LSI 4 described in the first to third embodiments. The insulating layers 31 and 34 are located on the LSIs 44a, 44b and the optical devices 2a and 2b. The LSI 44a is connected with the optical device 2a and the electrode pad 36, while the LSI 44b is connected with the optical device 2b and the electrode pad 36.

A method for manufacturing the photoelectric composite wiring module according to the fourth embodiment is performed in accordance with the manufacturing method of the third embodiment shown in FIGS. 5A to 5F. That is, stud bumps made of Au are formed on electrode pads of the LSIs 44a and 44b before bonding of the LSIs 44a and 44b to the first circuit substrate 1. Ultrasonic waves are applied to the stud bumps and Au contained in the surfaces of the electrodes 16 to bond the LSIs 44a, 44b to the first circuit substrate 1.

The following bonding method may be performed to mount the LSIs 44a and 44b. The LSIs 44a and 44b are bonded to the first circuit substrate 1 under the condition that circuit surfaces (upper surfaces) of the LSIs 44a and 44b are located on the upper sides of the LSIs and electrically connected to the electrode pads 36 before electrical connection of lower surfaces of the LSIs. An adhesive used to fix the LSIs 44a and 44b does not need to be transparent since the adhesive is not located in a region in which an optical signal is transferred. It is desirable in terms of simple manufacturing process that the method for electrically connecting the optical devices 2a and 2b to the first circuit substrate 1 and the electrode pad 36 be the same as the method for electrically connecting the LSIs 44a and 44b with the first circuit substrate 1 and the electrode pad 36. Both the electrical connection method described in the first embodiment and the electrical connection method described in the fourth embodiment may be used to electrically connect the LSIs 44a and 44b with the first circuit substrate 1 and the electrode pad 36 and electrically connect the optical devices 2a and 2b with the first circuit substrate 1 and the electrode pad 36, depending on where the electrodes of the optical devices 2a and 2b and the LSIs 44a and 44b are located.

In the present embodiment, the LSIs 44a and 44b are located in the same layer as the optical devices 2a and 2b. The LSIs 44a and 44b may be located in another layer included in the thin film wiring layer 3.

Fifth Embodiment

Figure 7:
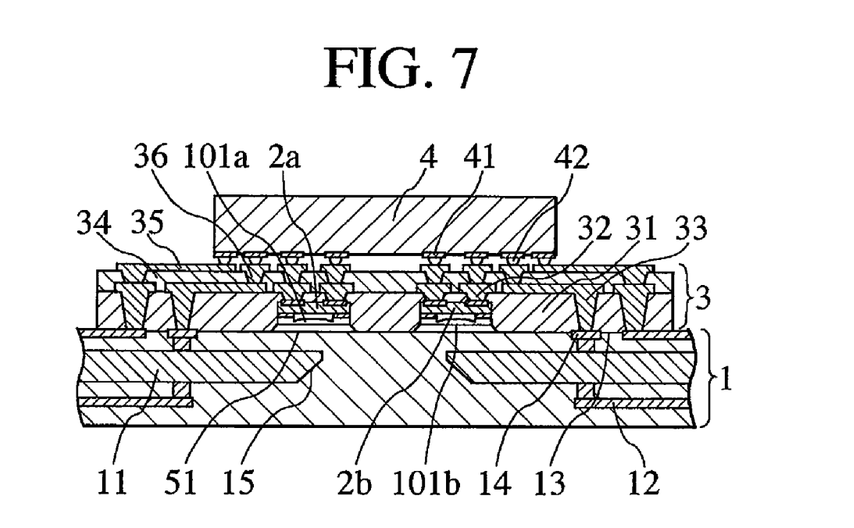
FIG. 7 is a schematic diagram showing a photoelectric composite wiring module according to a fifth embodiment of the present invention.

Next, a photoelectric composite wiring module according to the fifth embodiment of the present invention is described with reference to FIGS. 7 and 8A to 8F. FIG. 7 is a cross-sectional view of the photoelectric composite wiring module according to the fifth embodiment. FIGS. 8A to 8F are schematic diagrams showing a method for manufacturing the photoelectric composite wiring module according to the fifth embodiment. The photoelectric composite wiring module has a lens 101a on an optical axis extending between the edge portion 15 of one of the optical waveguides 11 and the optical device 2a. Also, the photoelectric composite wiring module has a lens 101b on an optical axis extending between the edge portion 15 of the other optical waveguide 11 and the optical device 2b. This structure improves the optical coupling efficiency.

The optical devices 2a and 2b are mounted above the lenses 101a and 101b, respectively. Light output from the optical device 2a spreads in a certain range. However, since the lens 101a is placed on the optical axis, the light is focused on and efficiently coupled to the optical waveguide 11 by means of the lens 101a. The focal length of the lens 101a is determined by an existing calculation formula for optical coupling on the basis of the beam spreading angle of the optical device 2a, the dimension of a core of the optical waveguide 11, positional relationships between the parts (optical device 2a, optical waveguide 11, and lens 101a), etc. such that the optical coupling efficiency and positional misalignment tolerance are satisfactory. Light output from the optical waveguide 11 spreads in a certain range and is focused by the lens 101b. Then, the light receiving device (optical device) 2b efficiently receives the focused light at its aperture. The focal length of the lens 101b is determined in the same way as the lens 101a. Configurations of the photoelectric composite wiring module according to the present embodiment other than the structure described above are the same as those of the photoelectric composite wiring module according to the first embodiment.

Figure 8A:
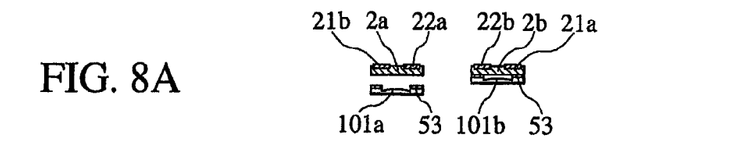
FIGS. 8A to 8F are schematic diagrams showing a method for manufacturing the photoelectric composite wiring module according to the fifth embodiment of the present invention.

The following describes the method for manufacturing the photoelectric composite wiring module shown in FIG. 7 with reference to FIGS. 8A to 8F. FIG. 8A shows a process of fixing the optical device 2a to the lens 101a and fixing the optical device 2b to the lens 101b. The light emitting point of the optical device 2a is aligned with an optical axis of the lens 101a. The light receiving surface of the optical device 2b is aligned with an optical axis of the lens 101b. Then, the optical device 2a is fixed to the lens 101a by means of a bonding material 53 attached to the lens 101a, and the optical device 2b is fixed to the lens 101b by means of a bonding material 53 attached to the lens 101b. The bonding materials 53 may be solder. Preferably the lens 101a includes a concave portion having a curved and convex surface facing the optical device 2a to prevent the lens 101a and the optical device 2a from being in contact with each other, as shown in FIG. 8A. Also, preferably the lens 101b includes a concave portion having a curved and convex surface facing the optical device 2b to prevent the lens 101b and the optical device 2b from being in contact with each other, as shown in FIG. 8A. The optical devices 2a and 2b may have respective curved lens surfaces (not shown) at the side of the first circuit substrate 1. Also, the optical devices 2a and 2b may have dual lens systems. That is, the optical devices 2a and 2b having the curved lens surfaces may be fixed to the lenses 101a and 101b, respectively. In the process of fixing the optical device 2a to the lens 101a and fixing the optical device 2b to the lens 101b, the optical devices 2a and 2b need to be aligned with the edge portions of the optical waveguides 11 to efficiently achieve optical coupling between the optical waveguides 11 and the optical devices 2a and 2b. For such a purpose, a mounting device (mounter or bonder) used to mount the optical devices 2a and 2b on the lenses 101a and 101b has a necessary degree of mounting accuracy.

Figure 8B:
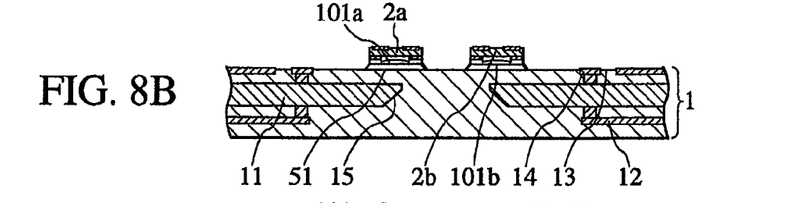

The thus-formed structure having the optical device 2a and the lens 101a, and the thus-formed structure having the optical device 2b and the lens 101b, are mounted on the surface layer 13 of the first circuit substrate 1 so as to achieve the optical coupling between the optical devices 2a, 2b and the optical waveguides 11 (refer to FIG. 8B). Thus, a structure shown in FIG. 8B is formed. An adhesive 51, which is transparent to the wavelength of the light to be used in the module, is used to bond the lenses 101a and 101b with the first circuit substrate 1. A method for coating the adhesive 51 is the same as the adhesive coating method described in the first embodiment. A mounting device used to mount the structures has a necessary degree of mounting accuracy. The lenses 101a and 101b may be first mounted on the first circuit substrate 1, and then the optical devices 2a and 2b may be mounted on the lenses 101a and 101b, respectively. An opaque adhesive by which optical paths is not obstructed may be used as the adhesive 51.

The lenses 101a and 101b may be fixed to the first circuit substrate 1 by soldering as long as the surfaces of the optical devices 2a and 2b can be metalized at the side of the circuit substrate 1. When side surfaces of the lenses 101a and 101b and side surfaces of the optical devices 2a and 2b are substantially matched, the structures are suitable for the formation of the insulating layer 31.

The photoelectric composite wiring module according to the fifth embodiment can be easily assembled compared with conventional techniques, similarly to the assembling of the module according to the first embodiment. Since the lenses are used, the photoelectric composite wiring module has a light focusing effect and a higher optical coupling efficiency. Air layers are present between the optical devices 2a, 2b and the lenses 101a, 101b. The structures may include bonding materials surrounding the air layers. In this case, dust or the like is not attached to inner surfaces of the structures. Thus, reduction in optical output of the module according to the present embodiment does not occur.

Figure 8C:
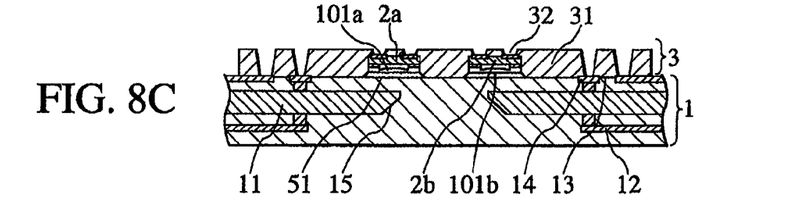
Figure 8D:
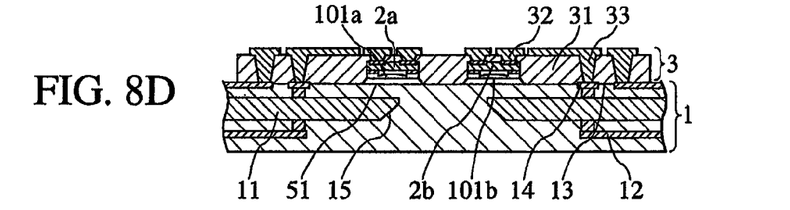
Figure 8E:
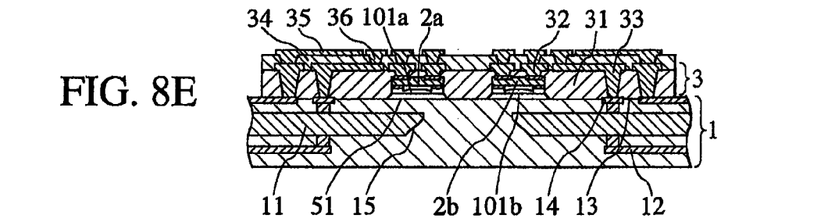
Figure 8F:
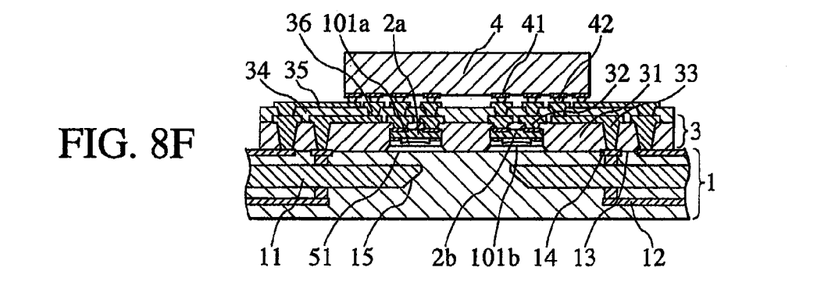

The thin film wiring layer 3 is formed on the structure shown in FIG. 8B (refer to FIGS. 8C and 8D). Procedures (shown in FIGS. 8C and 8D) for forming the thin film wiring layer 3 are the same as the procedures described in the first embodiment with reference to in FIGS. 2C and 2D. Lastly, the LSI 4 is mounted on the thin film wiring layer 3 (refer to FIG. 8F). In this way, the photoelectric composite wiring module according to the fifth embodiment is completed. The photoelectric composite wiring module according to the fifth embodiment may have redundancy in the same manner as the photoelectric composite wiring module according to the first embodiment.

Sixth Embodiment

Figure 9:
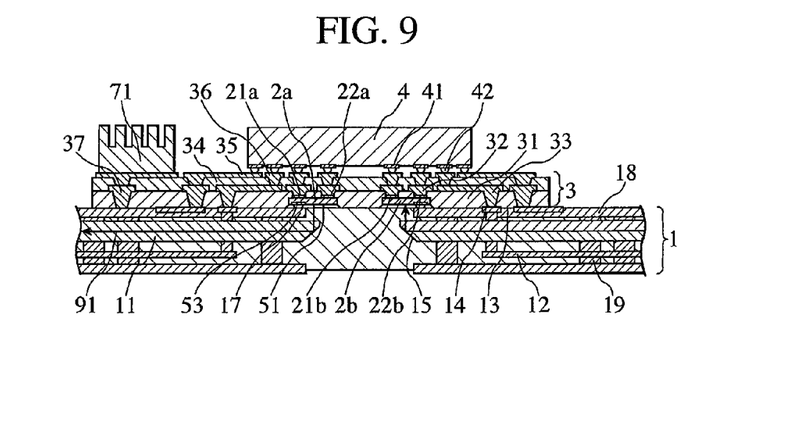
FIG. 9 is a schematic diagram showing a photoelectric composite wiring module according to a sixth embodiment of the present invention.

Next, a photoelectric composite wiring module according to the sixth embodiment of the present invention is described with reference to FIG. 9. In the first to third embodiments, heat generated by the optical devices is released by means of the electrical wiring that is connected with the electrodes of the optical devices and included in the thin film wiring layer. The photoelectric composite wiring module according to the sixth embodiment, however, has a structure that allows heat generated by the optical devices to be efficiently released.

The photoelectric composite wiring module according to the sixth embodiment has conductive pads 17. The conductive pads 17 are located near the optical devices 2a and 2b mounted on the first circuit substrate 1, respectively. A highly conductive bonding material 53 is used to bond the optical devices 2a and 2b with the electrode pads 17 in order to improve a heat-releasing property. In the present embodiment, solder is used as the highly conductive bonding material 53, and the optical devices 2a and 2b have metal pads made of Au on their surfaces at the side of the first circuit substrate 1 in order to connect the optical devices with the solder. The photoelectric composite wiring module according to the sixth embodiment has an upper conductive layer 18 formed widely on the upper surface of the first circuit substrate 1. The conductive pads 17 are connected with the upper conductive layer 18. The upper conductive layer 18 extends through the outside of a projection plane when the LSI 4 is projected on the first circuit substrate 1 to the periphery or outer edge of the first circuit substrate 1, with the upper conductive layer 18 serving as a heat spreader. The photoelectric composite wiring module according to the sixth embodiment also has a heat-releasing via 19 and a lower conductive layer 18. The lower conductive layer 18 is located on the lower surface of the first circuit substrate 1. The upper and lower conductive layers 18 are connected with the heat-releasing via 19 to release the heat generated by the optical devices to the lower conductive layer 18. The upper conductive layer 18 is connected with a heat-releasing via 37 formed in the thin film wiring layer 3. The heat generated by the optical devices is also transferred to the heat-releasing via 37. The module according to the present embodiment has a heat-releasing fin 71 serving as a heat-releasing member. The heat-releasing via 37 is connected with the heat-releasing fin 71 by means of a solder conductive bonding material in the thin film wiring layer 3. The heat-releasing fin 71 releases the heat generated by the optical devices 2a and 2b. This structure allows the heat generated by the optical devices to be efficiently released. Thus, operational characteristics of the photoelectric composite wiring module are stabilized.

In the present embodiment, the conductive pads 17 and the conductive layers 18 are used only as heat-releasing conductive members. The conductive pads 17 and the conductive layers 18 are electrically insulated from the electrical wirings of the first circuit substrate 1 and from the electrical wirings of the thin film wiring layer 3 although the insulation is not shown in FIG. 9. The conductive pads 17 and the conductive layers 18, however, may serve as the electrodes of the optical devices. Also, the conductive pads 17 and the conductive layers 18 may serve as ground wirings. In this case, the conductive pads 17 and the conductive layers 18 may be electrically connected with the electrical wirings of the first circuit substrate 1 and the like. The photoelectric composite wiring module has first to third heat-releasing paths. The first heat-releasing path extends through the upper conductive layer to the periphery or outer edge of the first circuit substrate 1. The second heat-releasing path extends through the heat-releasing via 19 included in the first circuit substrate 1. The third heat-releasing path extends through the heat-releasing via 37 included in the thin film wiring layer 3. The photoelectric composite wiring module may have only one or two of the three heat-releasing paths depending on the entire structure of the module, the amount of the heat generated by the optical devices and the like. The heat-releasing fin 71 may not be provided. The photoelectric composite wiring module may have a conductive block without a fin, or have a water cooling jacket without a fin. The heat-releasing fin 71 may be integrated with a cooling structure of the LSI 4. Alternatively, the heat-releasing fin 71 may be applied to the structure (shown in FIG. 3) having the optical devices included in the second circuit substrate.

Seventh Embodiment

Figure 10:
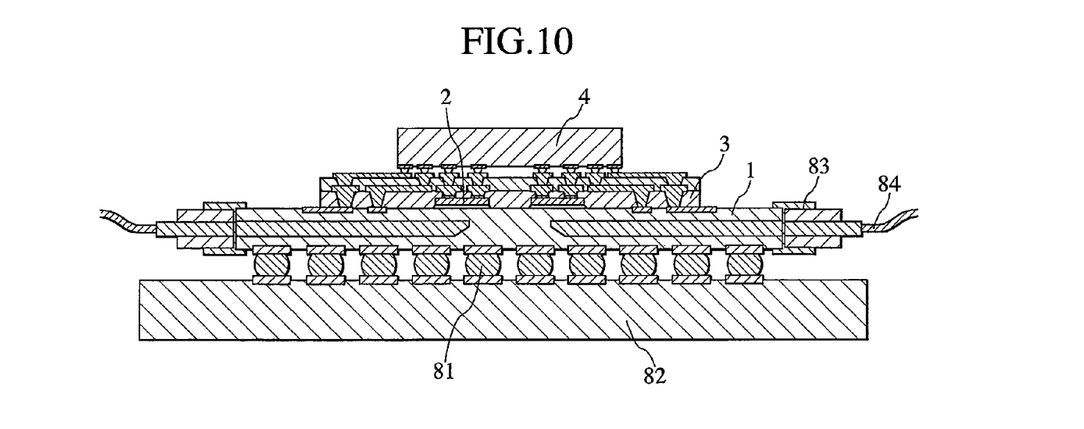
FIG. 10 is a schematic diagram showing a transmission device according to a seventh embodiment of the present invention.

The seventh embodiment describes the photoelectric composite wiring module according to the present invention, which is applied to a transmission device, with reference to FIG. 10. It should be noted that the electrical wirings of the first circuit substrate 1 and electrical wirings of a parent circuit substrate 82 are not illustrated in FIG. 10 for simplicity.

In FIG. 10, electrical power is supplied to the first circuit substrate 1 from a power source or the like. In this case, the electrical power is input from a back surface of the first circuit substrate 1. In the present embodiment, the first circuit substrate 1 is bonded to the parent circuit substrate 82 by means of solder bumps 81. The first circuit substrate 1, however, may be connected to the parent circuit substrate 82 by means of a pin or an electrical connector. A high-speed optical signal is coupled by an optical connector 83. In the present embodiment, the first circuit substrate 1 receives an optical signal from an optical fiber 84. The first circuit substrate 1, however, may receive an optical signal from an optical waveguide film, a circuit substrate having an optical transmission channel, or the like.

In the present embodiment, the photoelectric composite wiring module (shown in FIG. 1) according to the first embodiment is used. However, the photoelectric composite wiring modules according to the second to fourth embodiments may be applied to the seventh embodiment.

According to the present invention, the photoelectric composite wiring module is capable of transferring a signal at high speed, stably operating with reduced power, and being easily assembled with high yield. In addition, a transmission device using the photoelectric composite wiring module according to the present invention can be achieved.

What is claimed is:

1. A photoelectric composite wiring module, comprising:
    a first circuit substrate having an optical waveguide in which an optical signal propagates;
    an optical device mounted on a surface of the first circuit substrate and optically coupled to the optical waveguide;
    an insulating film formed on the first circuit substrate and the optical device;
    a wiring pad mounted on the insulating film;
    an electrical wiring connecting the optical device with the wiring pad; and
    a first semiconductor device mounted on and electrically connected with the wiring pad;
    wherein the optical device is located on the surface of the first circuit substrate, the surface of the first circuit substrate facing a side where the first semiconductor device is provided, the surface of the first circuit substrate being within a plane which projects the first semiconductor device on the surface of the first circuit substrate,
    wherein the first substrate has both a territory in which the insulating film covers the optical device and a territory not covered by the insulating film, and an optical connector for optically coupling the optical waveguide and an external optical element provided in the territory not covered by the insulating film,
    wherein the optical device and the wiring pad are connected with each other by means of a via formed in the insulating film,
    wherein the optical device has an electrode that is located at the side of the first semiconductor device and connected with the via, and
    wherein the wiring pad is located directly above the electrode of the optical device and wherein the electrode, the via, the wiring pad and a bump are all vertically aligned in a straight line.

2. The photoelectric composite wiring module according to claim 1, wherein
    the optical device is located between the first semiconductor device and the optical waveguide.

3. The photoelectric composite wiring module according to claim 1, wherein the optical device is located between the wiring pad and the optical waveguide.

4. The photoelectric composite wiring module according to claim 1, further comprising a second circuit substrate, wherein
    the optical device is mounted on the second circuit substrate and located at the side where the first circuit substrate is provided.

5. The photoelectric composite wiring module according to claim 1, further comprising a lens located on an optical axis extending between the optical device and the optical waveguide.

6. The photoelectric composite wiring module according to claim 1, wherein
    the first circuit substrate has a first conductive layer on the first surface of the first circuit substrate,
    the first conductive layer is connected with the optical device and located at the side where the optical device is provided,
    the first conductive layer extends to the outside of the projection plane of the semiconductor device.

7. The photoelectric composite wiring module according to claim 6, wherein
    the first circuit substrate has a second conductive layer on a second surface of the first circuit substrate, the first and second surfaces facing each other, and
    the first and second conductive layers are connected with each other by means of a via.

8. The photoelectric composite wiring module according to claim 6, further comprising a heat-releasing fin provided on the insulating film and connected with the first conductive layer.

9. A transmission device comprising the photoelectric composite wiring module described in claim 1, wherein
    the optical waveguide has an edge portion that is optically coupled to an optical fiber and located at the side opposite to the side on which the optical device is optically coupled to the optical waveguide, and the electrical wiring of the photoelectric composite wiring module is electrically connected with an electrical wiring located outside the module.

10. A method for manufacturing a photoelectric composite wiring module, comprising the steps of:
providing a first circuit substrate having an optical waveguide
mounting an optical device on the first circuit substrate to ensure that the optical device is optically coupled to an edge portion of the optical waveguide;
forming an insulating film on the first circuit substrate with the optical waveguide and the optical device being situated with the optical device optically coupled to the optical waveguide;
forming an electrical wiring in the insulating film to ensure that the electrical wiring is connected with the optical device;
forming a wiring pad on the insulating film to ensure that the wiring pad is connected with the electrical wiring; and
connecting the wiring pad to a semiconductor device,
wherein the optical device and the wiring pad are connected with each other by means of a via formed in the insulating film,
wherein the optical device has an electrode that is located at the side of the first semiconductor device and connected with the via, and
wherein the wiring pad is located directly above the electrode of the optical device and wherein the electrode, the via, the wiring pad and a bump are all vertically aligned in a straight line.

11. The manufacturing method according to claim 10, wherein
the semiconductor device is located above an area at which the optical device is provided.

12. The manufacturing method according to claim 11, wherein
the optical device is located between the semiconductor device and the optical waveguide.

13. The manufacturing method according to claim 10, wherein the optical device is located between the wiring pad and the optical waveguide.

14. The manufacturing method according to claim 10, wherein
the photoelectric composite wiring module has a second circuit substrate, and
the optical device is mounted on the second circuit substrate and located at the side where the first circuit substrate is provided.

15. The manufacturing method according to claim 10, further comprising the step of placing a lens on an optical axis extending between the optical device and the optical waveguide.

16. The manufacturing method according to claim 10, wherein
the first circuit substrate has a first conductive layer on a first surface of the first circuit substrate,
the first conductive layer is connected with the optical device, and
the first conductive layer extends to the outside of the projection plane of the semiconductor device.

17. The manufacturing method according to claim 16, wherein
the first circuit substrate has a second conductive layer on a second surface of the first circuit substrate, the first and second surfaces facing each other, and
the first and second conductive layers are connected with each other by means of a via.

18. The manufacturing method according to claim 16, further comprising the step of mounting a heat-releasing fin on a via that is formed on the insulating film and connected with conductive layer.

* * * * *